(12) United States Patent
Fujii et al.

(10) Patent No.: US 9,245,856 B2
(45) Date of Patent: Jan. 26, 2016

(54) SEMICONDUCTOR DEVICE

(71) Applicant: Shinko Electric Industries Co., Ltd., Nagano-ken (JP)

(72) Inventors: Tomoharu Fujii, Nagano (JP); Yoshihiro Ihara, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/590,252

(22) Filed: Jan. 6, 2015

(65) Prior Publication Data

US 2015/0221599 A1    Aug. 6, 2015

(30) Foreign Application Priority Data

Feb. 3, 2014  (JP) ................................ 2014-018663

(51) Int. Cl.
*H01L 23/12*    (2006.01)
*H01L 23/00*    (2006.01)
*H01L 23/31*    (2006.01)

(52) U.S. Cl.
CPC .............. *H01L 23/564* (2013.01); *H01L 23/12* (2013.01); *H01L 24/48* (2013.01); *H01L 23/3128* (2013.01); *H01L 2224/45144* (2013.01); *H01L 2224/48* (2013.01); *H01L 2924/00014* (2013.01); *H01L 2924/161* (2013.01)

(58) Field of Classification Search
CPC ......... H01L 23/12; H01L 23/13; H01L 23/48; H01L 23/66; H01L 23/564; H01L 24/48; H01L 24/49; H01L 2223/6605; H01L 2223/6611; H01L 2223/6677; H01L 2924/161
See application file for complete search history.

(56) References Cited

U.S. PATENT DOCUMENTS

| | | | | |
|---|---|---|---|---|
| 6,008,451 A | * | 12/1999 | Ichinose et al. | 136/256 |
| 2009/0026560 A1 | * | 1/2009 | Wombacher et al. | 257/415 |
| 2011/0127655 A1 | * | 6/2011 | Fujii | 257/664 |

FOREIGN PATENT DOCUMENTS

JP        2011-114192        6/2011

* cited by examiner

*Primary Examiner* — Armando Rodriguez
(74) *Attorney, Agent, or Firm* — Fish & Richardson P.C.

(57) ABSTRACT

A semiconductor device includes a wiring substrate. The wiring substrate includes a first surface, a second surface located at an opposite side of the first surface, a cavity formed in the first surface, an electrode pad formed on the first surface surrounding the cavity, and a high frequency wire exposed on the first surface. A semiconductor element is accommodated in the cavity. A bonding wire connects the semiconductor element and the electrode pad. A first protection film is arranged on the first surface of the wiring substrate to cover the first surface, the semiconductor element, the electrode pad, the bonding wire, and the high frequency wire.

24 Claims, 6 Drawing Sheets

SEMICONDUCTOR DEVICE

CROSS-REFERENCE TO RELATED APPLICATIONS

This application is based upon and claims the benefit of priority from prior Japanese Patent Application No. 2014-018663, filed on Feb. 3, 2014, the entire contents of which are incorporated herein by reference.

FIELD

This disclosure relates to a semiconductor device.

BACKGROUND

A semiconductor device includes a wiring substrate on which semiconductor elements are mounted. When the semiconductor element (i.e., semiconductor chip) includes a circuit for a high frequency such as the milliwave band, an antenna is connected to the high frequency circuit. The antenna is connected to the semiconductor element by a bonding wire. Japanese Laid-Out Patent Publication No. 2011-114192 describes one example of a wiring substrate including an antenna. In the wiring substrate, the semiconductor element and the bonding wire are covered by a recessed cap which is adhered to the wiring substrate.

SUMMARY

In a semiconductor device that covers the semiconductor element and the bonding wire with a cap, it is difficult to sufficiently prevent the intrusion of moisture or the like into the portion where the semiconductor element is mounted. Accordingly, the protection of the semiconductor element is insufficient.

One aspect of this disclosure is a semiconductor device including a wiring substrate. The wiring substrate includes a first surface, a second surface located at an opposite side of the first surface, a cavity formed in the first surface, an electrode pad formed on the first surface surrounding the cavity, and a high frequency wire exposed on the first surface. A semiconductor element is accommodated in the cavity. A bonding wire connects the semiconductor element and the electrode pad. A first protection film coats the first surface of the wiring substrate, the semiconductor element, the electrode pad, the bonding wire, and the high frequency wire.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

One embodiment will now be described with reference to the drawings. In the drawings, elements are illustrated for simplicity and clarity and have not necessarily been drawn to scale. To facilitate understanding, hatching lines may not be illustrated in the cross-sectional drawings.

Figure 1A:
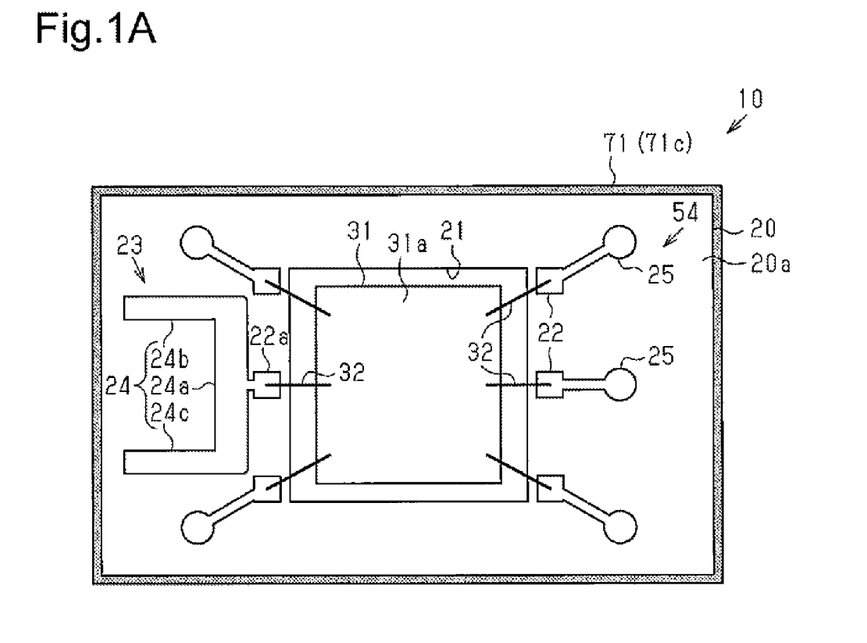
FIG. 1A is a schematic plan view illustrating a semiconductor device.

As illustrated in FIG. 1A, a semiconductor device 10 includes a wiring substrate 20 and a semiconductor element 31 (i.e., semiconductor chip). The wiring substrate 20 is, for example, tetragonal as viewed from above and includes an upper surface 20a, a lower surface 20b, and a cavity 21. The cavity 21 is, for example, tetragonal as viewed from above. In the present embodiment, the cavity 21 is formed in the upper surface 20a of the wiring substrate 20 and accommodates the semiconductor element 31.

Figure 1B:
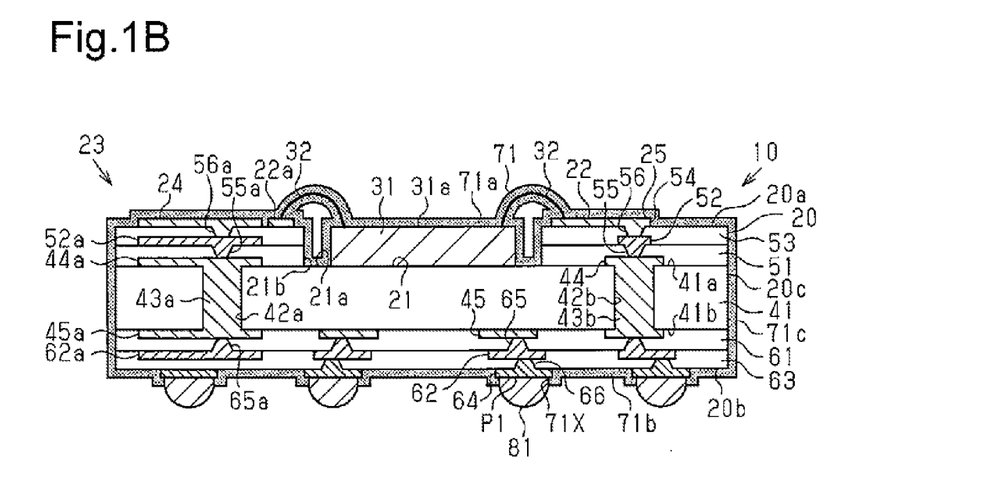
FIG. 1B is a schematic cross-sectional view of the semiconductor device illustrated in FIG. 1A.

As illustrated in FIG. 1B, the cavity 21 and the semiconductor element 31 have the same thickness. Accordingly, when the semiconductor element 31 is accommodated in the cavity 21, the upper surface 20a of the wiring substrate 20 is substantially flush with the upper surface 31a of the semiconductor element 31.

The semiconductor element 31 is, for example, a silicon chip (die) including a certain device. The semiconductor element 31 is obtained by forming a plurality of devices on a silicon wafer by performing a given device process and dicing the silicon wafer into units of devices. The semiconductor element 31 is accommodated in the cavity 21 with a device formation surface (upper surface 31a) facing the upper side. Although not illustrated in the drawings, electrode pads for external connection are formed on the upper surface 31a of the semiconductor element 31. The cavity 21 includes a bottom surface 21a and side surfaces 21b. For example, an adhesive applied to the bottom surface 21a fixes the semiconductor element 31 to the cavity 21. The adhesive is, for example, a conductive paste that is hardened after the semiconductor element 31 is placed on the conductive paste. The conductive paste is formed by, for example, dispersing fine metal grains of Ag, Cu, or the like in a thermosetting resin such as an epoxy resin.

As illustrated in FIG. 1A, a plurality of (six in FIG. 1A) electrode pads 22 are formed on the upper surface 20a of the wiring substrate 20 surrounding the cavity 21. The material of the electrode pads 22 is, for example, copper or an alloy including copper. A bonding wire 32 connects each electrode pad 22 to an electrode pad (not illustrated) formed on the upper surface 31a of the semiconductor element 31. The material of the bonding wire 32 is, for example, gold (Au).

An antenna 23 serving as a high frequency wire, or high frequency antenna, is formed on the wiring substrate 20. The antenna 23 is connected to one of the electrode pads 22. In other words, the electrode pads 22 include an electrode pad 22a that is connected to the antenna 23. The electrode pad 22a is connected to the semiconductor element 31 by a bonding wire 32. That is, the semiconductor element 31 is electrically connected to the antenna 23 by the bonding wire 32 and the electrode pad 22a. The electrode pad 22a is one example of an antenna connection pad.

In the present embodiment, the wiring substrate 20 is a multilayer wiring substrate including a plurality of wiring layers. The antenna 23 includes a plurality of wires formed in the plurality of wiring layers and one or more vias (via wires) connecting the wires of the adjacent wiring layers. One of the wiring layers includes a wire 24 formed on the upper surface 20a of the wiring substrate 20. Accordingly, the antenna 23 is exposed on the upper surface 20a of the wiring substrate 20.

FIG. 1A illustrates a wiring layer 54 arranged on the upper surface 20a of the wiring substrate 20. The wiring layer 54 includes the electrode pads 22 (including the electrode pad 22a), the wire 24 forming a portion of the antenna 23, and wires 25 connected to the electrode pads 22. The wire 24 of the antenna 23 includes wire portions 24a to 24c. For example, the wire portion 24a extends along one side of the cavity 21 as viewed from above (refer to FIG. 1A), and the middle of the wire portion 24a is connected to the electrode pad 22a. The wire portion 24b extends from one end of the wire portion 24a toward the end of the wiring substrate 20, and the wire portion 24c extends from the other end of the wire portion 24a toward the end of the wiring substrate 20.

The wiring substrate 20 will now be described.

As illustrated in FIG. 1B, the wiring substrate 20 includes a core substrate 41. The core substrate 41 is, for example, a glass epoxy substrate that is formed by, for example, impregnating a glass cloth (glass woven fabric), which is a reinforcement material, with a thermosetting insulative resin and hardening the insulative resin. The main component of the thermosetting insulative resin is an epoxy resin. The reinforcement material is not limited to the glass cloth. For example, a glass non-woven fabric, an aramid woven fabric, an aramid non-woven fabric, a liquid crystal polymer (LCP) woven fabric, or an LCP non-woven fabric may be used as the reinforcement material. The thermosetting insulative resin is not limited to epoxy resin. For example, a polyimide resin or a cyanate resin may be used as the thermosetting insulative resin.

The core substrate 41 includes an upper surface 41a, a lower surface 41b, and through holes 42a and 42b, which extend through the core substrate 41 from the upper surface 41a to the lower surface 41b. Through electrodes 43a and 43b are formed in the through holes 42a and 42b. The material of the through electrodes 43a and 43b is, for example, copper or a copper alloy.

A wiring layer 44 is formed on the upper surface 41a of the core substrate 41, and a wiring layer 45 is formed on the lower surface 41b of the core substrate 41. The through electrodes 43a and 43b electrically connect the wiring layers 44 and 45. The wiring layer 44 includes a wire 44a, which forms a portion of the antenna 23, and the wiring layer 45 includes a wire 45a, which forms a portion of the antenna 23.

An insulation layer 51, a wiring layer 52, an insulation layer 53, and the wiring layer 54 are stacked in this order on the upper surface 41a of the core substrate 41. The material of the insulation layers 51 and 53 is, for example, an insulative resin such as an epoxy resin or a polyimide resin. The material of the wiring layers 52 and 54 is, for example, copper. As described above, the wiring layer 54 includes the electrode pads 22 (including the electrode pad 22a) and the wires 24 and 25. The insulation layer 51 includes via wires 55, which extend through the insulation layer 51 and connect the wiring layers 52 and 44 to each other. The wiring layer 52 includes a wire 52a, which forms a portion of the antenna 23. The via wires 55 include via wires 55a connecting the wire 52a of the wiring layer 52 to the wire 44a of the wiring layer 44. The insulation layer 53 includes via wires 56, which extend through the insulation layer 53 and connect the wiring layers 54 and 52 to each other. The via wires 56 include via wires 56a that connect the wire 24 of the wiring layer 54 to the wire 52a of the wiring layer 52.

An insulation layer 61, a wiring layer 62, an insulation layer 63, and a wiring layer 64 are stacked in this order on the lower surface 41b of the core substrate 41. The material of the insulation layers 61 and 63 is, for example, an insulative resin such as an epoxy resin or a polyimide resin. The material of the wiring layers 62 and 64 is, for example, copper. The wiring layer 62 includes a wire 62a, which forms a portion of the antenna 23. The insulation layer 61 includes via wires 65, which extend through the insulation layer 61 and connect the wiring layers 62 and 45 to each other. The via wires 65 include a via wire 65a connecting the wire 62a of the wiring layer 62 to the wire 45a of the wiring layer 45. The insulation layer 63 includes via wires 66, which extend through the insulation layer 63 and connect the wiring layers 64 and 62 to each other.

When viewed from above, the wires 44a, 45a, 52a, and 62 are shaped identically to the wire 24 illustrated in FIG. 1A. Although FIG. 1B illustrates only one via wire 56a, the wires 24 and 52a are connected by two or more via wires 56a. In the same manner, the wires 52a and 44a are connected by two or more via wires 55a. In the same manner, the wires 45a and 62a are connected by two or more via wires 65a. Further, although only one through electrode 43a is illustrated in FIG. 1B, the wires 44a and 45a are connected by two or more through electrodes 43a.

In this manner, in the present embodiment, the wires 24, 52a, 44a, 45a, and 62a respectively formed in the wiring layers 54, 52, 44, 45, and 62, the via wires 56a, 55a, and 65a, and the through electrode 43a form the antenna 23.

As illustrated in FIG. 1B, a protection film 71 covers the wiring substrate 20, the semiconductor element 31, and the bonding wires 32. In the preferred embodiment, the protection film 71 includes first to third protection films 71a to 71c.

The first protection film 71a covers the upper surface 20a of the wiring substrate 20, which is the upper surface of the uppermost insulation layer 53 in the present embodiment. Further, the first protection film 71a covers the semiconductor element 31 and the bonding wires 32. The first protection film 71a also covers the exposed surfaces of the cavity 21 accommodating the semiconductor element 31, that is, the bottom surface 21a and the side surfaces 21b of the cavity 21. Moreover, the first protection film 71a covers the surfaces (upper surface and side surfaces) of the wiring layer 54, which includes the electrode pads 22 and the wire 24. In this manner, the first protection film 71a coats the upper surface 20a of the wiring substrate 20, the semiconductor element 31, the bonding wires 32, the cavity 21, the electrode pads 22, and the wire 24 (antenna 23).

The second protection film 71b covers the lower surface 20b of the wiring substrate 20, which is the lower surface of the lowermost insulation layer 63 in the present embodiment, and the surface of the wiring layer 64. As illustrated in FIGS. 1A and 1B, the third protection film 71c covers the side surfaces 20c of the wiring substrate 20, which are the side surfaces of the insulation layers 51, 53, 61, and 63 and the side surfaces of the core substrate 41. The first to third protection films 71a to 71c are formed continuously. FIG. 1A does not illustrate the first protection film 71a arranged on the upper surface 20a of the wiring substrate 20.

The material of the protection film 71 may be, for example, a paraxylylene resin, an acrylic resin, or a fluorine resin. These resins have low permittivities and are electrically insulative. Further, the protection film 71 has a lower permittivity than the core substrate 41 of the wiring substrate 20 and the insulation layers 51, 53, 61, and 63. The protection film 71 (protection films 71a to 71c) has a thickness of several micrometers (e.g., 1 to 3 μm). For example, the permittivity of a paraxylylene resin is 2 to 3.

The second protection film 71b, which covers the lower surface 20b of the wiring substrate 20, includes openings 71X that expose portions of the wiring layer 64 as connection pads P1. External connection terminals 81 are connected to the connection pads P1. The external connection terminals 81 are, for example, solder balls.

The operation of the semiconductor device 10 will now be described.

As illustrated in FIG. 1B, the upper surface 20a of the wiring substrate 20 is flush with the upper surface 31a of the semiconductor element 31. Accordingly, relatively short bonding wires 32 may be used to connect the semiconductor element 31 and the antenna 23 formed in the wiring substrate 20. This limits degradation in the quality of high frequency signals transferred between the semiconductor element 31 and the antenna 23.

The protection film 71 (first protection film 71a) covers the upper surface 20a of the wiring substrate 20, the semiconductor element 31, the bonding wires 32, the cavity 21, the electrode pads 22, and the wire 24 (antenna 23). The protection film 71 has a low permittivity and is electrically insulative. Further, the protection film 71 has a thickness of several micrometers. Accordingly, the protection film 71 subtly affects the transmission of high frequency signals through the signal transmission line of the antenna 23 and the bonding wires 32.

Further, the first protection film 71a integrally covers the wiring layer 54, the semiconductor element 31, and the bonding wires 32 on the upper surface 20a of the wiring substrate 20. This prevents the wiring layer 54, the semiconductor element 31, and the bonding wires 32 from becoming oxidized or wet without using a resist film, a cap, or the like.

The manufacturing steps of the semiconductor device 10 will now be described with reference to FIGS. 2 to 6, which include only the reference characters used to describe each step.

Figure 2:
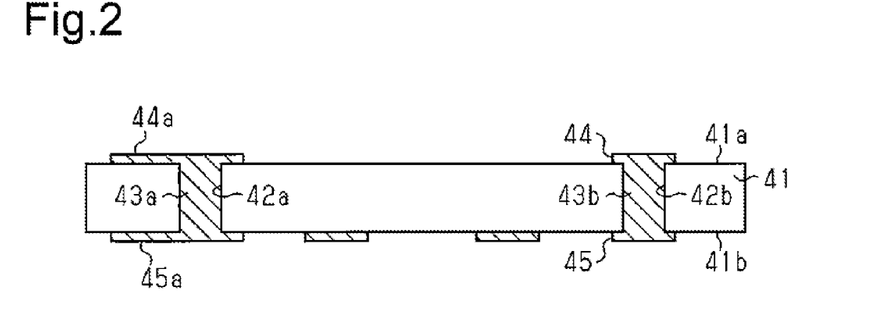
FIGS. 2 to 6 are schematic cross-sectional views illustrating manufacturing steps of the semiconductor device illustrated in FIG. 1A.

First, the structure illustrated in FIG. 2 is formed. For example, a copper-clad laminate is used as the core substrate 41. In this case, the through holes 42a and 42b are formed in the copper-clad laminate. Then, the through holes 42a and 42b undergo processing to form the through electrodes 43a and 43b in the through holes 42a and 42b. The processing may be performed by, for example, electrolytic plating the through holes 42a and 42b or filling the through holes 42a and 42b with a paste. The copper-clad laminate may be formed, for example, by placing copper foils on both surfaces of a pre-preg and heating and pressurizing the pre-preg together with the copper foils. The through holes 42a and 42b are formed using, for example, a laser processor or a boring machine. Then, for example, a subtractive process is performed to form the wiring layer 44 on the upper surface 41a of the core substrate 41, and form the wiring layer 45 on the lower surface 41b of the core substrate 41. The wiring layers 44 and 45 include the wires 44a and 45a that form part of the antenna 23. The wiring layers 44 and 45 may be formed by performing, for example, a semi-additive process or an additive process.

Figure 3:
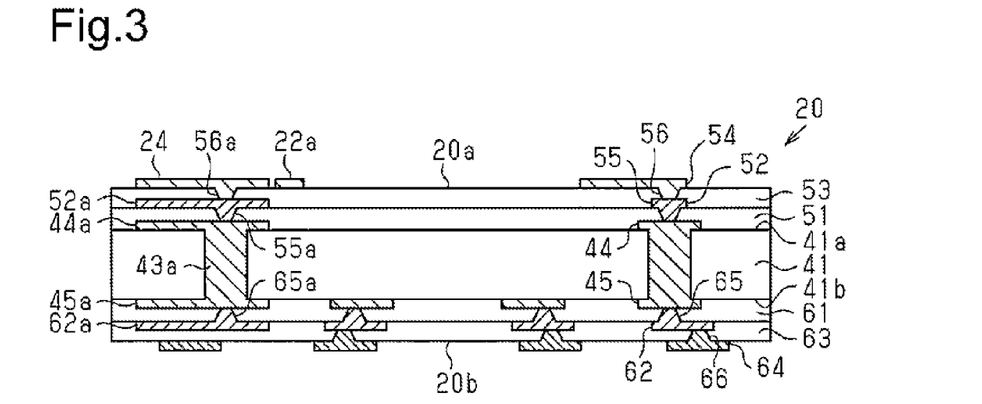

Then, the structure illustrated in FIG. 3 is formed. For example, a buildup process is performed to form the insulation layers 51, 53, 61, and 63, the wiring layers 52, 54, 62, and 64, and the via wires 55 (55a), 56 (56a), 65 (65a), and 66.

First, the insulation layer 51 is formed covering the upper surface 41a of the core substrate 41 and the wiring layer 44, and the insulation layer 61 is formed covering the lower surface 41b of the core substrate 41 and the wiring layer 45. For example, the insulation layers 51 and 61 are formed by covering the upper surface 41a and the lower surface 41b of the core substrate 41 with a resin film and hardening the resin film. The material of the resin film is, for example, a thermosetting insulative resin such as an epoxy resin or a polyimide resin and used in a B-stage (semi-hardened) state. For example, resin films are pressed against the upper surface 41a and the lower surface 41b of the core substrate 41 with a pressing machine under a depressurized atmosphere. Then, the resin films are heated and hardened to form the insulation layers 51 and 61.

Then, openings are formed in the insulation layers 51 and 61 with, for example, a laser processor. The via wires 55 (55a) are formed in the openings of the insulation layer 51, and the wiring layer 52 (wires 52a) are formed connected to the via wires 55. In the same manner, the via wires 65 (65a) are formed in the openings of the insulation layer 61, and the wiring layer 62 (wires 62a) are formed connected to the via wires 65. The via wires 55 (55a) and 65 (65a) and the wiring layers 52 (52a) and 62 (62a) are formed by performing, for example, a semi-additive process. In the same manner, the insulation layer 53 is formed covering the insulation layer 51 and the wiring layer 52 (52a), and the insulation layer 63 is formed covering the insulation layer 61 and the wiring layer 62 (62a). Then, openings are formed in the insulation layers 53 and 63. Further, the via wires 56 (56a) and 66 and the wiring layers 54 (wire 24) and 64 (wire 64a) are formed. This forms the wiring substrate 20 including the upper surface 20a (upper surface of insulation layer 53) and the lower surface 20b (lower surface of insulation layer 63). In the wiring substrate 20, the wiring layers 54 and 64 are exposed on the upper surface 20a and the lower surface 20b, respectively.

Figure 4:
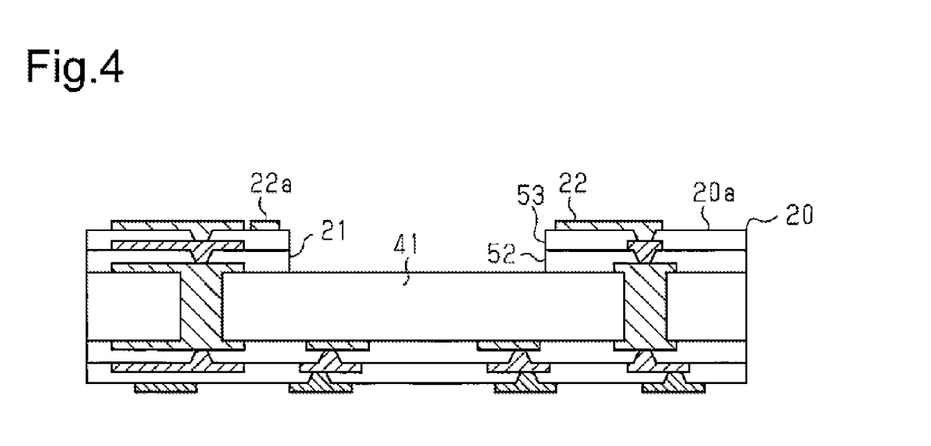

Referring to FIG. 4, a router or the like is used to machine the upper surface 20a of the wiring substrate 20 and form the cavity 21 having a depth corresponding to the thickness of the semiconductor element 31 (refer to FIG. 1B).

Figure 5:
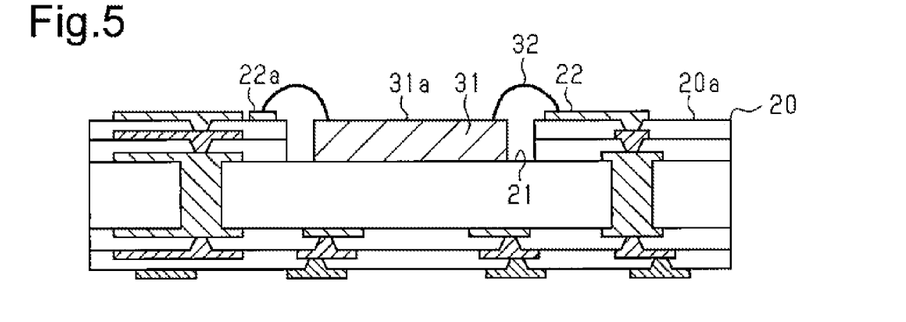

Referring to FIG. 5, the semiconductor element 31 is placed in the cavity 21. For example, an adhesive of a conductive paste or the like is applied to the bottom surface of the cavity 21, and the semiconductor element 31 is placed on the adhesive. The adhesive is hardened to fix the semiconductor element 31 to the cavity 21. Then, pads (not illustrated) formed on the upper surface 31a of the semiconductor element 31 are connected to the electrode pads 22 (22a) formed on the upper surface 20a of the wiring substrate 20 with the bonding wires 32.

Figure 6:
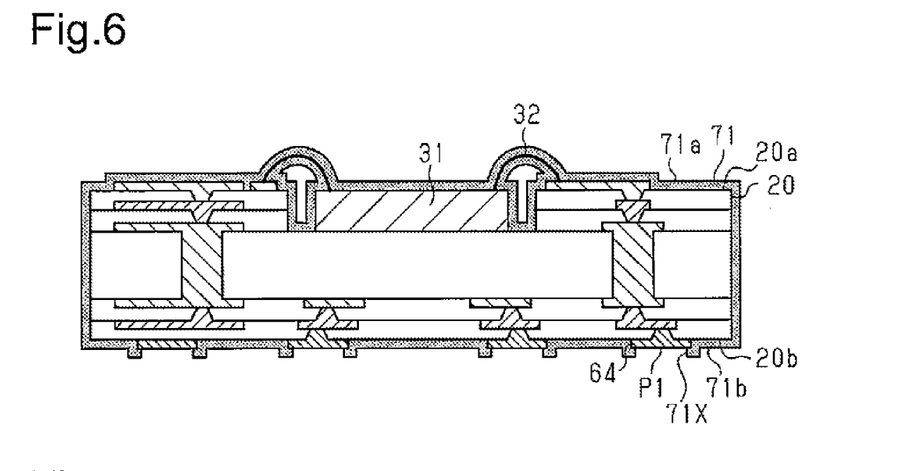

Referring to FIG. 6, the protection film 71 is formed. The protection film 71 is formed in a vacuum process. For example, the structure of FIG. 5 (wiring substrate 20, semiconductor element 31, and bonding wires 32) is loaded into a vacuum chamber. Then, the vacuum chamber is supplied with a highly reactive gas. This forms the protection film 71 shaped in conformance with the structure of FIG. 5. When the protection film 71 is formed, a mask such as a resist film is formed covering a portion of the wiring layer 64 exposed from the lower surface 20b of the wiring substrate 20. After forming the protection film 71, the mask is removed to form the openings 71X in the protection film 71 (71b). The portions of the wiring layer 64 exposed from the openings 71X function as the connection pads P1. Then, a paste of solder or the like is applied to the connection pads P1 and a reflow process is performed to form the external connection terminals 81 illustrated in FIG. 1B. The protection film 71 has high heat resistance (e.g., 350° C. or higher). This limits the influence received by the protection film 71 from the influence of the heat produced during the reflow process when forming the external connection terminals 81.

The present embodiment has the advantages described below.

(1) The semiconductor element 31 is accommodated in the cavity 21 of the wiring substrate 20. The wire 24 of the antenna 23 is exposed on the upper surface 20a of the wiring substrate 20. The wire 24 is connected to the semiconductor element 31 by the electrode pad 22a and the bonding wire 32. The protection film 71 (71a) covers the electrode pads 22, the wire 24, the semiconductor element 31, and the bonding wires 32 on the upper surface 20a of the wiring substrate 20. Accordingly, the wiring layer 54, the semiconductor element 31, and the bonding wires 32 are prevented from becoming oxidized or wet without using a resist film, a cap, or the like. This improves the reliability of the semiconductor device 10.

(2) The protection film 71 has a low permittivity and is electrically insulative. Further, the protection film 71 has a thickness of several micrometers. Accordingly, the protection film 71 subtly affects the transmission of high frequency signals through the signal transmission line of the antenna 23, the bonding wires 32, and the like. Further, the protection film 71 covers the wiring layer 54, the semiconductor element 31, and the bonding wires 32 on the upper surface 20a of the wiring substrate 20. This prevents the wiring layer 54, the semiconductor element 31, and the bonding wires 32 from becoming oxidized or wet without using a resist film, a cap, or the like. Thus, the semiconductor device 10 may be reduced in size.

(3) The semiconductor device 10 is used in an electronic device such as a cellular phone. This limits enlargement of the electronic device that uses the semiconductor device 10.

(4) The upper surface 20a of the wiring substrate 20 is substantially flush with the upper surface 31a of the semiconductor element 31. Accordingly, relatively short bonding wires 32 may be used to connect the semiconductor element 31 and the antenna 23 formed in the wiring substrate 20. This limits degradation in the quality of high frequency signals transferred between the semiconductor element 31 and the antenna 23.

It should be apparent to those skilled in the art that the present invention may be embodied in many other specific forms without departing from the spirit or scope of the invention. Particularly, it should be understood that the present invention may be embodied in the following forms.

Figure 7:
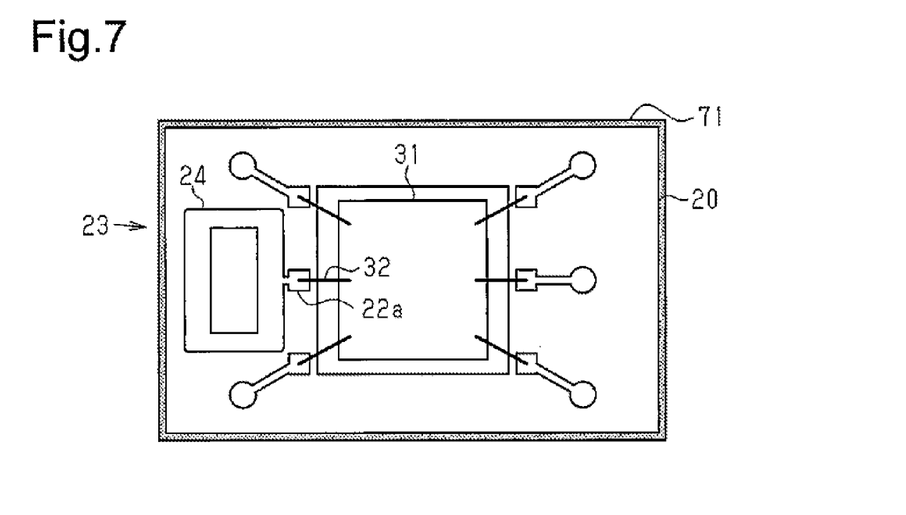
FIG. 7 is a schematic plan view illustrating a further example of an antenna.

In the above embodiment, the shape of the antenna 23 may be changed. For example, as illustrated in FIG. 7, the antenna 23 formed on the wiring substrate 20 may include a wire 24 (wire formed on uppermost wiring layer) having the shape of a tetragonal frame as viewed from above. Although not illustrated in the drawings or the description, in the same manner as the above embodiment, the antenna 23 of FIG. 7 includes portions of wires formed in wiring layers of the wiring substrate 20, and the wire of each wiring layer is formed to have the shape of a tetragonal frame like the wire 24. The wire 24 of the antenna 23 is connected to the semiconductor element 31 by the electrode pad 22a and a bonding wire 32. The shape of the antenna 23 may be changed to be tetragonal as viewed from above. Further, the number of the wiring layers (wires) of the antenna 23 may be changed. For example, the antenna 23 may be formed by only the wiring layer formed on the upper surface of the wiring substrate 20.

Figure 8:
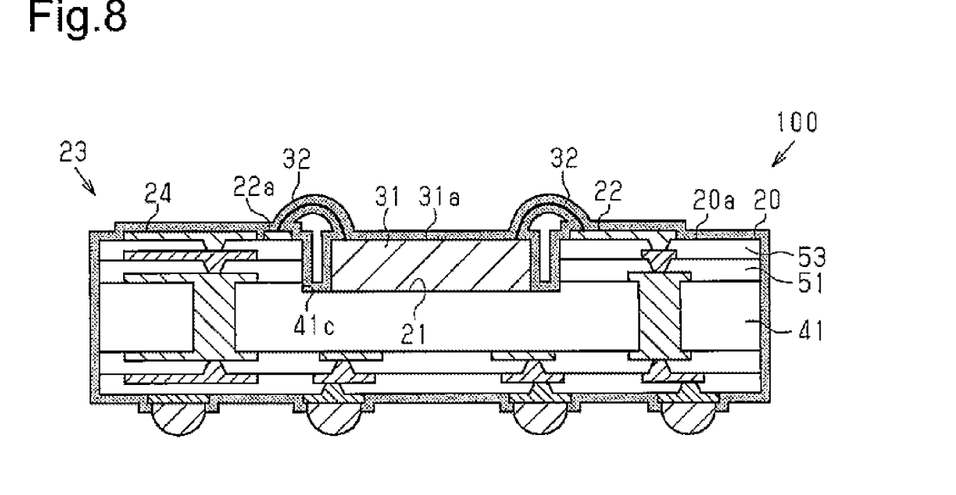
FIG. 8 is a schematic cross-sectional view illustrating a further example of a cavity.

In the above embodiment, the depth of the cavity 21 may be changed in accordance with the thickness (height) of the semiconductor element 31 accommodated in the cavity 21. For example, in the semiconductor device 100 illustrated in FIG. 8, portions of the insulation layers 51 and 53 and the core substrate 41 are machined to form the cavity 21. More specifically, a recess 41c that deepens the cavity 21 may be formed in the upper surface of the core substrate 41. Also, in this case, it is preferred that the upper surface 31a of the semiconductor element 31 in the cavity 21 be substantially flush with the upper surface 20a of the wiring substrate 20. This allows relatively short bonding wires 32 to be used to connect the semiconductor element 31 and the electrode pad 22 (22a) of the wiring substrate 20 in order to electrically connect the semiconductor element 31 and the antenna 23 (wire 24).

Figure 9:
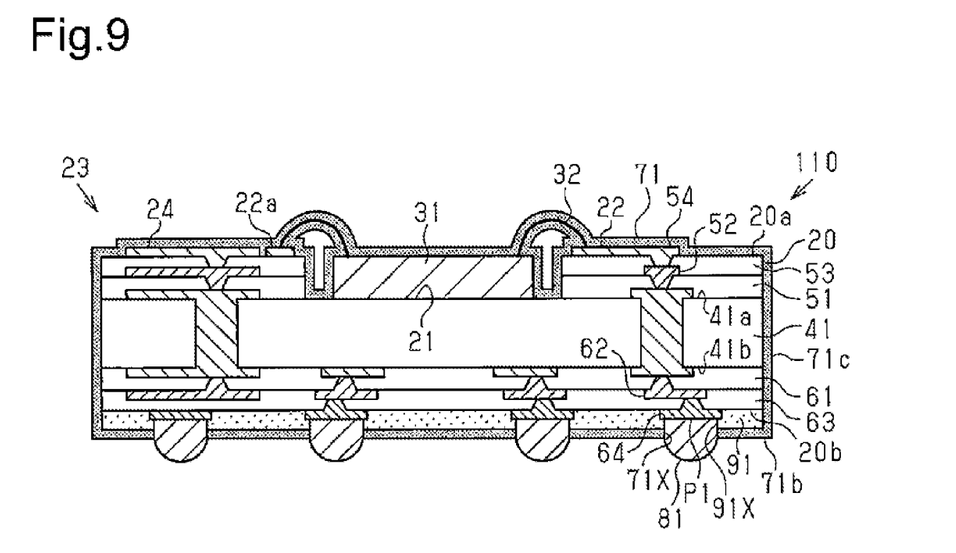
FIG. 9 is a schematic cross-sectional view illustrating a further example of a semiconductor device.

The semiconductor device 10 of the above embodiment may be changed to a semiconductor device 110 illustrated in FIG. 9. The semiconductor device 110 includes a solder resist 91 that covers the lower surface 20b of the wiring substrate 20. Further, the protection film 71 (71b and 71c) covers the solder resist 91. The protection film 71 has a lower permittivity than the solder resist 91. The semiconductor device 110 has the same advantages as the semiconductor device 10.

In detail, the semiconductor device 110 includes the wiring substrate 20 and the semiconductor element 31, which is accommodated in the cavity 21 of the wiring substrate 20. A bonding wire 32 connects an electrode pad (not illustrated) formed on the upper surface 31a of the semiconductor element 31 to the electrode pad 22a formed on the upper surface 20a of the wiring substrate 20. The antenna 23 is formed in the wiring substrate 20, and the electrode pad 22a and the bonding wire 32 connect the wire 24 of the antenna 23 to the semiconductor element 31.

In the semiconductor device 110, the wiring substrate 20 includes the core substrate 41, the insulation layers 51 and 53 and the wiring layers 52 and 54 that are stacked on the upper surface 41a of the core substrate 41, and the insulation layers 61 and 63 and the wiring layers 62 and 64 that are stacked on the lower surface 41b of the core substrate 41. The solder resist 91 covers the insulation layer 63 and the wiring layer 64. The protection film 71 (71b and 71c) covers the solder resist 91. The solder resist 91 and the protection film 71 respectively include openings 91X and 71X that expose portions of the wiring layer 64 as the connection pads P1. The openings 91X of the solder resist 91 are shaped identically to the openings 71X of the protection film 71. For example, a mask (resist film) is formed to cover portions of the wiring layer 64 when forming the solder resist 91 and the protection film 71. After the formation of the solder resist 91 and the protection film 71, the mask is removed to form the openings 91X and 71X. The external connection terminals 81 are formed on the connection pads P1.

In the above embodiment, the number of insulation layers and wiring layers illustrated in FIG. 1B is only one example. The number of insulation layers and wiring layers stacked on the upper surface 41a of the core substrate 41 may be changed. In the same manner, the number of insulation layers and wiring layers stacked on the lower surface 41b of the core substrate 41 may be changed.

In the above embodiment, the core substrate 41 may include a plurality of insulation layers and wiring layers. In this case, the antenna 23 may include wires formed in each layer of the core substrate. The wires of the core substrate may be electrically connected to one another by via wires and the through electrodes 43a formed in the same manner as the via wires 55a, 56a, and 65a illustrated in FIG. 1B.

In the above embodiment, the method for forming the protection film 71 may be changed. For example, a protection paint including a resin material may be sprayed onto the structure of FIG. 5 (wiring substrate 20, semiconductor element 31, and bonding wires 32). Then, the protection paint (resin material) is hardened to form the protection film 71.

Figure 10A:
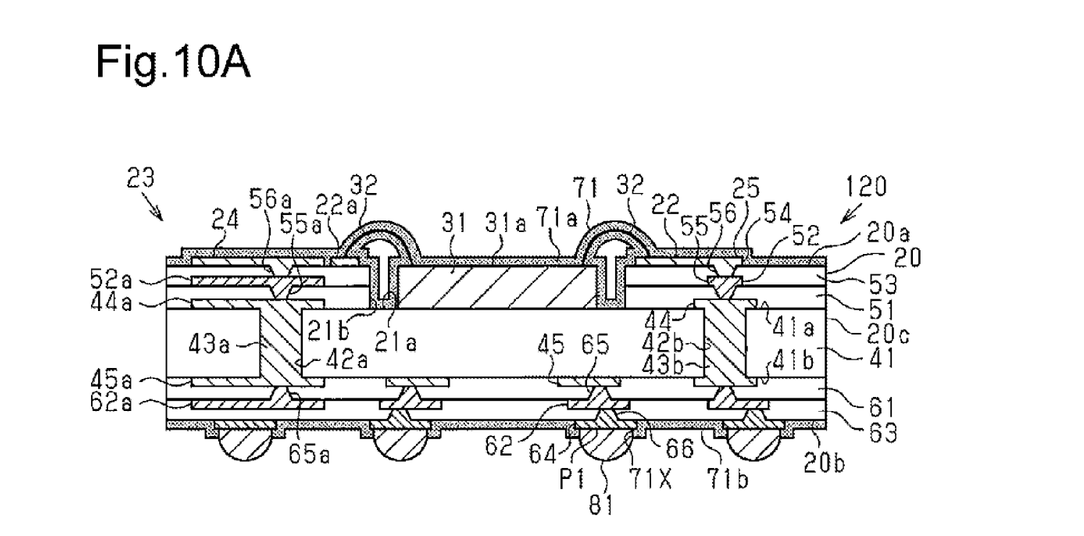
FIG. 10A is a schematic cross-sectional view illustrating a further example of a protection film.

In the above embodiment, the surface covered by the protection film 71 may be changed. For example, in a semiconductor device 120 illustrated in FIG. 10A, the side surfaces 20c of the wiring substrate 20 are exposed. That is, the protection film 71c illustrated in FIG. 1B may be omitted. For example, the protection film 71 (71a and 71b) is formed on the upper surface and the lower surface of a structure including a plurality of semiconductor devices. Then, the structure is cut and singulated into semiconductor devices. The semiconductor device 120 has the same advantages as the above embodiment.

Figure 10B:
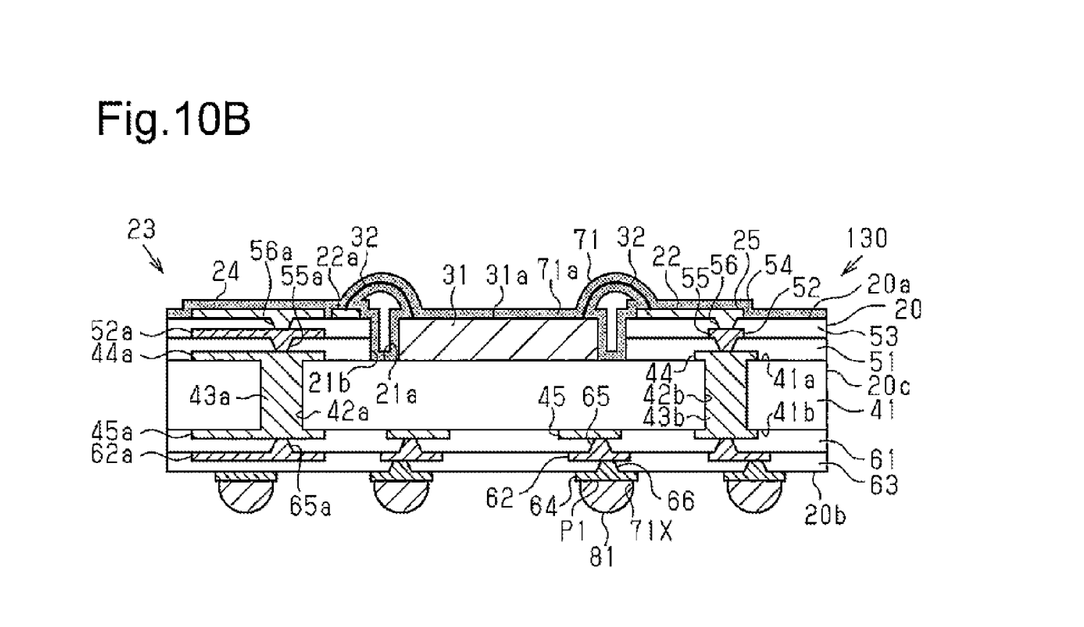
FIG. 10B is a schematic cross-sectional view illustrating another example of a protection film.

Further, the semiconductor device 10 of the above embodiment may be changed to a semiconductor device 130 illustrated in FIG. 10B. In the semiconductor device 130, the protection film 71 includes only the first protection film 71a. That is, the protection film 71 (71a) covers the upper surface 20a of the wiring substrate 20, the semiconductor element 31, and the bonding wires 32 and exposes the side surfaces 20c and the lower surface 20b of the wiring substrate 20. Although not illustrated in FIG. 10B, the semiconductor device 130 may include the solder resist 91 of FIG. 9 that covers the lower surface 20b and exposes the side surfaces 20c. The semiconductor device 130 has the same advantages as the above embodiment.

Figure 11:
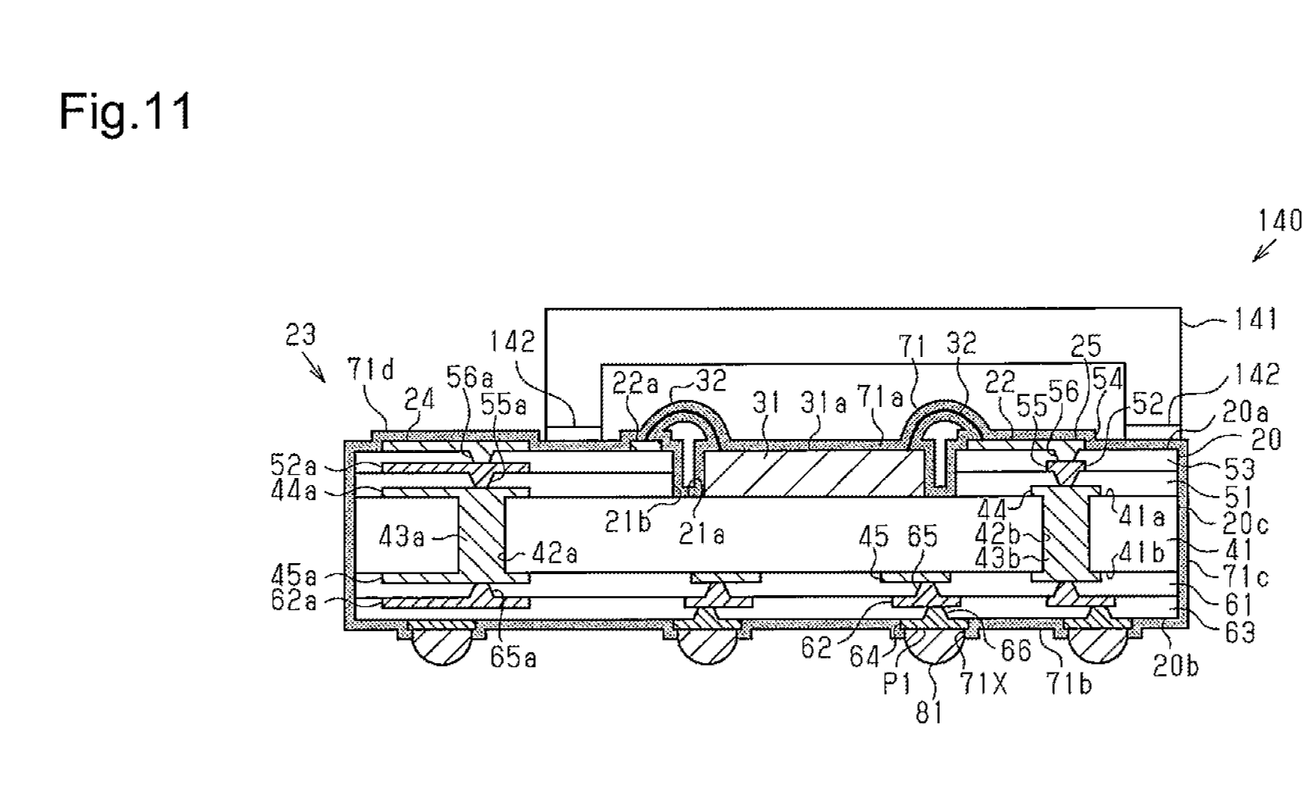
FIG. 11 is a schematic cross-sectional view illustrating another example of a semiconductor device.

In the above embodiment, a cap may be further provided to protect the semiconductor element 31 and the bonding wires 32. For example, as illustrated in FIG. 11, a semiconductor device 140 includes a cap 141. The cap 141 is arranged on the upper surface of the protection film 71 (first protection film 71) to cover the semiconductor element 31 and the bonding wires 32. For example, the cap 141 is fixed to the protection film 71 (first protection film 71a) by an adhesive 142. The cap 141 is hollow. The first protection film 71a includes a fourth protection film 71d that covers the wire 24 of the antenna 23. The fourth protection film 71d is not covered by the cap 141. The material of the cap 141 is a heat resistant resin, for example, an epoxy resin. The material of the adhesive 142 is a heat resistant thermosetting resin, for example, an epoxy resin. The protection film 71 has a lower permittivity than the cap 141 and the adhesive 142. The cap 141 and the adhesive 142 withstand the temperature of a reflow process (approximately 240° C. to 260° C.) performed when forming the external connection terminals 81. The cap 141 prevents contact with the semiconductor element 31 and the bonding wires 32. Contact with the semiconductor element 31 or the bonding wires 32 may cause damage of the semiconductor element 31 or breakage of a bonding wire 32. Accordingly, the cap 141 improves the reliability of the semiconductor device 140. The cap 141 which exposes the wires 24 does not adversely affect the properties of the antenna 23.

The cap 141 may also be applied to the semiconductor device of each of the above modifications. For example, in FIG. 11, the protection film 71c, which covers the side surfaces 20c of the wiring substrate 20, and the protection film 71b, which covers the lower surface 20b of the wiring substrate 20, may be omitted. Further, the lower surface 20b may be covered by the solder resist 91 (refer to FIG. 9).

In the above embodiment, the material of the core substrate 41 may be changed. For example, a glass or ceramic substrate may be used as the core substrate 41.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
   a wiring substrate including a first surface, a second surface located at an opposite side of the first surface, a cavity formed in the first surface, an electrode pad formed on the first surface surrounding the cavity, and a high frequency wire exposed on the first surface;
   a semiconductor element accommodated in the cavity;
   a bonding wire that connects the semiconductor element and the electrode pad; and
   a first protection film coating the first surface of the wiring substrate, the semiconductor element, the electrode pad, the bonding wire, and the high frequency wire, wherein
   the wiring substrate is a multilayer wiring substrate including a plurality of wiring layers, and
   the high frequency wire serves as a high frequency antenna, wherein the high frequency antenna is formed by a plurality of wires that are formed in the wiring layers and connected to each other.

2. The semiconductor device according to claim 1, further comprising a cap attached to the first surface of the wiring substrate to cover the semiconductor element and the bonding wire,
   wherein the high frequency wire is exposed from the cap.

3. The semiconductor device according to claim 1, further comprising:
   a connection pad formed on the second surface of the wiring substrate; and
   a second protection film coating the second surface of the wiring substrate,
   wherein the second protection film includes an opening that exposes the connection pad.

4. The semiconductor device according to claim 1, further comprising:
   a connection pad formed on the second surface of the wiring substrate;
   a solder resist film that covers the second surface of the wiring substrate and includes a first opening exposing the connection pad; and
   a second protection film that covers the solder resist film and includes a second opening at a location corresponding to the first opening.

5. The semiconductor device according to claim 3, further comprising a third protection film that is continuous with the first protection film and the second protection film and covers a side surface of the wiring substrate.

6. The semiconductor device according to claim 4, further comprising a third protection film that is continuous with the first protection film and the second protection film and covers a side surface of the wiring substrate.

7. The semiconductor device according to claim 1, wherein the first protection film is formed by a paraxylylene resin, an acrylic resin, or a fluorine resin.

8. The semiconductor device according to claim 1, wherein the first surface of the wiring substrate is flush with a surface of the semiconductor element, the surface of the semiconductor element being connected to the bonding wire.

9. The semiconductor device according to claim 1, wherein the cavity is filled with the first protection film.

10. The semiconductor device according to claim 1, wherein the wiring substrate includes a core substrate that forms a bottom surface of the cavity.

11. The semiconductor device according to claim 10, wherein the core substrate includes a recess that deepens the cavity.

12. The semiconductor device according to claim 1, wherein:

the wiring substrate includes
a core substrate including an upper surface and a lower surface,
one or more upper insulation layers stacked on the upper surface of the core substrate,
one or more upper wiring layers stacked alternately with the upper insulation layers on the upper surface of the core substrate,
one or more lower insulation layers stacked on the lower surface of the core substrate, and
one or more lower wiring layers stacked alternately with the lower insulation layers on the lower surface of the core substrate;
the one or more upper insulation layers include an uppermost insulation layer including an upper surface that defines the first surface of the wiring substrate;
the one or more lower insulation layers include a lowermost insulation layer including a lower surface that defines the second surface of the wiring substrate;
the semiconductor device further comprises
a second insulation film that covers the lower surface of the lowermost insulation layer, and
a third insulation film that covers a side surface of the core substrate, a side surface of each of the upper insulation layers, and a side surface of each of the lower insulation layers; and
the first to third insulation films are continuous with one another.

13. A semiconductor device comprising:
a wiring substrate including a first surface, a second surface located at an opposite side of the first surface, a cavity formed in the first surface, an electrode pad formed on the first surface surrounding the cavity, and a high frequency wire exposed on the first surface;
a semiconductor element accommodated in the cavity;
a bonding wire that connects the semiconductor element and the electrode pad; and
a first protection film coating the first surface of the wiring substrate, the semiconductor element, the electrode pad, the bonding wire, and the high frequency wire, wherein:
the wiring substrate includes
an uppermost insulation layer including an upper surface that defines the first surface of the wiring substrate, and
an uppermost wiring layer stacked on the uppermost insulation layer;
the high frequency wire is a high frequency antenna including a wire formed on the uppermost wiring layer and exposed on the upper surface of the uppermost insulation layer;
the electrode pad is one of a plurality of electrode pads arranged on the upper surface of the uppermost insulation layer and serves as an antenna connection pad connected to the wire of the high frequency antenna; and
the first protection film covers the upper surface of the uppermost insulation layer, the semiconductor element, the electrode pads including the antenna connection pad, the bonding wire, and the wire of the high frequency antenna.

14. The semiconductor device according to claim 13, further comprising a cap attached to the first surface of the wiring substrate to cover the semiconductor element and the bonding wire,
wherein the high frequency wire is exposed from the cap.

15. The semiconductor device according to claim 13, further comprising:
a connection pad formed on the second surface of the wiring substrate; and
a second protection film coating the second surface of the wiring substrate,
wherein the second protection film includes an opening that exposes the connection pad.

16. The semiconductor device according to claim 13, further comprising:
a connection pad formed on the second surface of the wiring substrate;
a solder resist film that covers the second surface of the wiring substrate and includes a first opening exposing the connection pad; and
a second protection film that covers the solder resist film and includes a second opening at a location corresponding to the first opening.

17. The semiconductor device according to claim 15, further comprising a third protection film that is continuous with the first protection film and the second protection film and covers a side surface of the wiring substrate.

18. The semiconductor device according to claim 16, further comprising a third protection film that is continuous with the first protection film and the second protection film and covers a side surface of the wiring substrate.

19. The semiconductor device according to claim 13, wherein the first protection film is formed by a paraxylylene resin, an acrylic resin, or a fluorine resin.

20. The semiconductor device according to claim 13, wherein the first surface of the wiring substrate is flush with a surface of the semiconductor element, the surface of the semiconductor element being connected to the bonding wire.

21. The semiconductor device according to claim 13, wherein the cavity is filled with the first protection film.

22. The semiconductor device according to claim 13, wherein the wiring substrate includes a core substrate that forms a bottom surface of the cavity.

23. The semiconductor device according to claim 22, wherein the core substrate includes a recess that deepens the cavity.

24. The semiconductor device according to claim 13, wherein:
the wiring substrate includes
a core substrate including an upper surface and a lower surface,
one or more upper insulation layers stacked on the upper surface of the core substrate,
one or more upper wiring layers stacked alternately with the upper insulation layers on the upper surface of the core substrate,
one or more lower insulation layers stacked on the lower surface of the core substrate, and
one or more lower wiring layers stacked alternately with the lower insulation layers on the lower surface of the core substrate;
the one or more upper insulation layers include an uppermost insulation layer including an upper surface that defines the first surface of the wiring substrate;
the one or more lower insulation layers include a lowermost insulation layer including a lower surface that defines the second surface of the wiring substrate;
the semiconductor device further comprises
a second insulation film that covers the lower surface of the lowermost insulation layer, and
a third insulation film that covers a side surface of the core substrate, a side surface of each of the upper insulation layers, and a side surface of each of the lower insulation layers; and the first to third insulation films are continuous with one another.

* * * * *